United States Patent
Clark

(10) Patent No.: US 8,539,012 B2
(45) Date of Patent: Sep. 17, 2013

(54) MULTI-RATE IMPLEMENTATION WITHOUT HIGH-PASS FILTER

(75) Inventor: Jeffrey Clark, Alhambra, CA (US)

(73) Assignee: Audyssey Laboratories, Los Angeles, CA (US)

( * ) Notice: Subject to any disclaimer, the term of this patent is extended or adjusted under 35 U.S.C. 154(b) by 465 days.

(21) Appl. No.: 13/006,164

(22) Filed: Jan. 13, 2011

(65) Prior Publication Data

US 2012/0185524 A1 Jul. 19, 2012

(51) Int. Cl.
*G06F 17/10* (2006.01)

(52) U.S. Cl.
USPC ...................................... 708/313

(58) Field of Classification Search
None
See application file for complete search history.

(56) References Cited

U.S. PATENT DOCUMENTS

| | | | |
|---|---|---|---|
| 5,579,004 A | 11/1996 | Linz | |
| 5,621,675 A | 4/1997 | Linz et al. | |
| 5,646,621 A | 7/1997 | Cabler et al. | |
| 5,966,188 A | 10/1999 | Patel et al. | |
| 6,134,570 A * | 10/2000 | Camagna et al. | 708/313 |
| 6,442,216 B1 | 8/2002 | McLaughlin et al. | |
| 6,600,788 B1 | 7/2003 | Dick et al. | |
| 6,876,698 B1 | 4/2005 | Dick et al. | |
| 7,283,076 B1 | 10/2007 | Ding et al. | |
| 7,577,220 B2 * | 8/2009 | Becker et al. | 375/355 |
| 8,176,107 B2 * | 5/2012 | Sturza et al. | 708/313 |
| 2007/0156800 A1 * | 7/2007 | Sturza et al. | 708/300 |
| 2008/0285768 A1 * | 11/2008 | Larsen et al. | 381/73.1 |
| 2011/0099213 A1 * | 4/2011 | Snelgrove | 708/3 |
| 2012/0185524 A1 * | 7/2012 | Clark | 708/313 |

\* cited by examiner

*Primary Examiner* — David H Malzahn

(74) *Attorney, Agent, or Firm* — Kenneth L. Green

(57) ABSTRACT

A filtering method approximates a target Finite Impulse Response (FIR) (or transversal) filter and reduces computational requirements by eliminating high pass filtering required by known multi-rate filters. An input signal is copied into two identical signals and processed in parallel by a full-rate path, and by a reduced-rate path. Parallel filters are computed and applied in each path, the reduced-rate signal is up-sampled, and the two signals summed. The high pass filter required by known multi-rate filters is eliminated and the low pass filter in the prior art is implicit in a down sampling. Linear phase FIR filters are used for down and up sampling, resulting in constant group delay. Added benefits include the option of zero added latency through the filtering and the constant group delay added to the target FIR. The user may choose criteria such as minimum resolution in each band.

19 Claims, 8 Drawing Sheets

A. Anti-Aliasing Filter Impulse Response

B. Anti-Aliasing Filter Frequency Response

A. Low Rate Filter Impulse Response (at decimated rate)

B. Low Rate Filter Frequency Response

MULTI-RATE IMPLEMENTATION WITHOUT HIGH-PASS FILTER

BACKGROUND OF THE INVENTION

The field of the invention is digital signal filtering and in particular methods to improve low frequency resolution without increasing processing requirements.

Broadband digital signals often require filtering for their intended use. For example, in audio systems, signals may be filtered (often referred to as equalizing) to compensate for characteristics of speakers and the listening environment. Such digital signals must be at a sufficiently high sample rate to carry the high frequency signal components. Finite Impulse Response (FIR) (or transversal) filters are preferred in many applications to maintain linear phase or minimum phase for accurate sound reproduction. In order to filter such signals using a single FIR filter, the filtering must be performed at the high sample rate of the digital signal, and to achieve high resolution filtering for low frequencies present in the signal, a very long FIR filter is also required. In some audio systems the resulting processing requirements cannot be performed economically.

Multi-rate filters have been introduced to overcome the very long FIR filter requirement of single filter implementations. Such multi-rate filters separate the digital signal into at least two bands. A high frequency signal band is processed at the high sample rate of the original signal using a short FIR filter and a parallel low frequency band is first down sampled to a lower sample rate, filtered using a FIR filter which may be much shorter than the traditional filter required by the single filter implementation, and up sampled back to the original sample rate. The two filtered signals are then summed to provide the desired filtered signal. Such multi-rate filters include a high pass filter to provide the high frequency signal, and a separate low pass filter to provide the separate parallel low frequency signal. While Infinite Impulse Response (IIR) high pass and low pass filters might be used in the multi-rate filter, but unfortunately such IIR filters introduce differing group delay above and below the transition frequency and may distort the resulting audio signal. Alternatively, linear phase FIR's may be used, but unfortunately the FIR high and low pass filters are computationally intense, and minimize the benefit of the multi-rate filtering approach.

BRIEF SUMMARY OF THE INVENTION

The present invention addresses the above and other needs by providing a filtering method which approximates a target Finite Impulse Response (FIR) (or transversal) filter and reduces computational requirements by eliminating high pass filtering required by known multi-rate filters. An input signal is copied into two identical signals and processed in parallel by a full-rate path, and by a reduced-rate path. Parallel filters are computed and applied in each path, the reduced-rate signal is up-sampled, and the two signals summed. The high pass filter required by known multi-rate filters is eliminated and the low pass filter in the prior art is implicit in a down sampling. Linear phase FIR filters are used for down and up sampling, resulting in constant group delay. Added benefits include the option of zero added latency through the filtering and the constant group delay added to the target FIR filter. The user may choose criteria such as minimum resolution in each band.

In accordance with one aspect of the invention, there is provided a method of calculating a pair of FIR filters, and a corresponding signal processing diagram for applying the calculated filters. The filters are derived to eliminate the need for a separate high pass filter required by known multi-rate filters.

In accordance with another aspect of the invention, there is provided a signal filtering method which includes an option of zero added latency through the filtering and constant group delay added to the target FIR.

In accordance with another aspect of the invention, the user may choose criteria such as minimum resolution in each band for an approximation of the target FIR filter.

BRIEF DESCRIPTION OF THE SEVERAL VIEWS OF THE DRAWING

The above and other aspects, features and advantages of the present invention will be more apparent from the following more particular description thereof, presented in conjunction with the following drawings wherein.

DETAILED DESCRIPTION OF THE INVENTION

The following description is of the best mode presently contemplated for carrying out the invention. This description is not to be taken in a limiting sense, but is made merely for the purpose of describing one or more preferred embodiments of the invention. The scope of the invention should be determined with reference to the claims.

A prior art digital filter with a single Finite Impulse Response (FIR) filter (the target FIR filter) 10 applied to an input signal 12 to produce a filtered signal 14. The Target FIR filter 10 must perform operations at the high sample rate of the input signal 12 and also be of sufficient length to provide accurate filtering to low frequency components in the input signal. The resulting processing may require a very large number of operations at the high sample rate.

Figure 1:
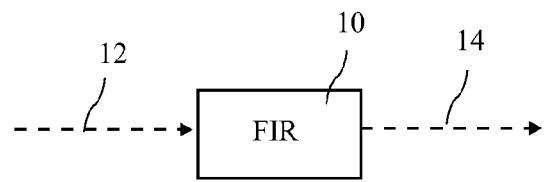
FIG. 1 is a prior art digital filter with a single Finite Impulse Response (FIR) filter applied to the input signal.
Figure 2:
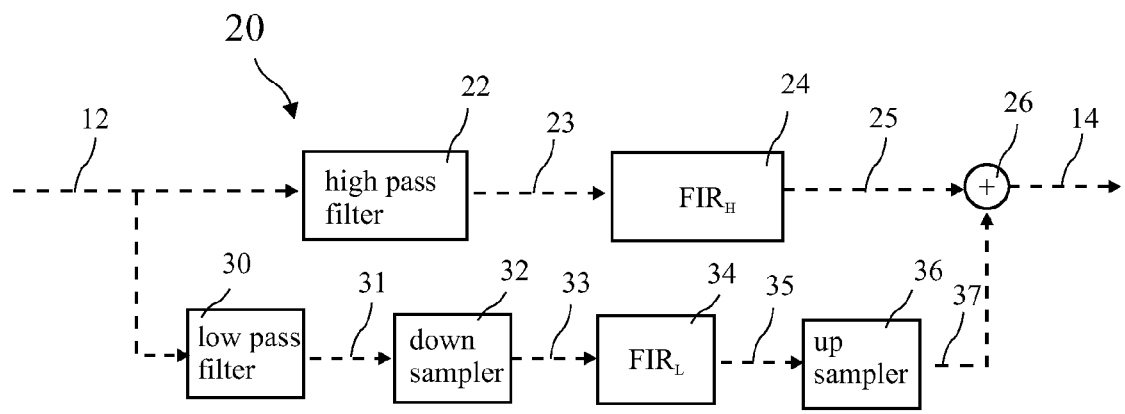
FIG. 2 is a prior art multi-rate digital filter with two parallel FIR filters applied to the input signal.

A prior art multi-rate digital filter 20 with two parallel FIR filters, $FIR_H$ 24 and $FIR_L$ 34, applied to the input signal 12 is shown in FIG. 2. The input signal 12 is processed by a high pass filter 22 providing a high frequency signal 23 for processing by the $FIR_H$ 24 to provide a filtered high frequency signal 25. The input signal 12 is also processed by a low pass filter 30 to produce a low frequency signal 31 at the original sample rate, down sampled by a down-sampling filter 32 to produce a down sampled low frequency signal 33. The down sampled low frequency signal 33 is processed by the $FIR_L$ 34 to provide a filtered down sampled low frequency signal 35 which is up-sampled by up-sampler 36 to provide a filtered low frequency signal 37 at the original sample rate. The filtered high frequency signal 25 and the filtered low frequency signal 37 are summed by the summer 26 to provide the filtered signal 14. The multi-rate digital filter 20 reduces the processing required by the Target FIR filter 10 because the $FIR_L$ filter 34 operates at a much lower sample rate than the Target FIR filter 10. Alternatively, the low pass filter 30 may be an anti-aliasing filter intrinsic in the down-sampler 32.

Figure 3:
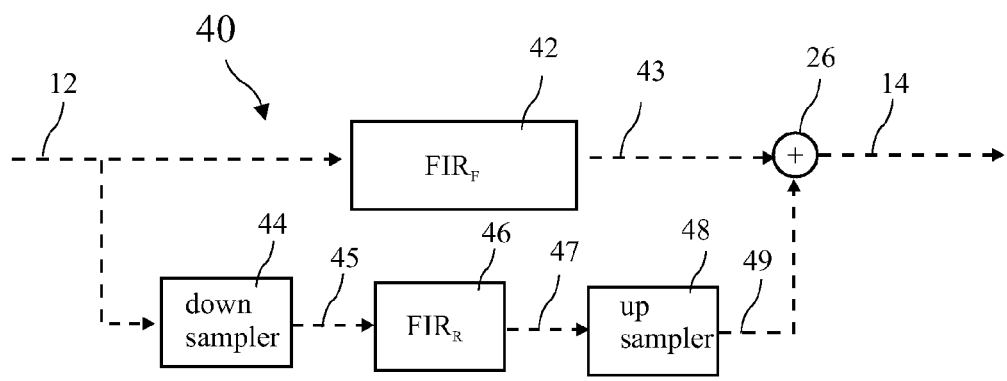
FIG. 3 is an improved multi-rate filter according to the present invention applied to the input signal.

An improved multi-rate filter 40 according to the present invention is shown applied to the input signal 12 in FIG. 3. While the multi-rate digital filter 20 is an improvement compared to the filter 10, the high and low pass filters 22 and 30 are either: Infinite Impulse Response (IIR) filters which adds differing group delays; or computationally intensive FIR filters. The multi-rate filter 40 includes a second high frequency (or full-rate) filter $FIR_F$ 42 replacing both the high pass filter 22 and the filter $FIR_H$ 24 and a second low frequency (or reduced-rate) filter $FIR_R$ 46 replacing both the low pass filter 30 and the filter $FIR_L$ 34.

The full-rate filter $FIR_F$ 42 filters the input signal 12 to provide a filtered full-rate signal 43. A second down-sampler 44 down samples the input signal 12 to provide a down sampled (or reduced-rate) signal 45. The reduced-rate filter $FIR_R$ 46 filters the reduced-rate signal 45 to provide a filtered reduced-rate signal 47. A second up sampler 48 up samples the filtered reduced-rate signal 47 to provide an up sampled filtered signal 49. The summer 26 sums the filtered full-rate signal 43 with the up sampled filtered signal 49 to provide the filtered signal 14. The resulting filter 40 thus reduces overall computational requirements by eliminating high pass filter 22 in the known multi-rate filter 20. The resulting filter 40 provides added benefits including the option of zero added latency through the filtering and constant group delay added to the target FIR because the IIR high and low pass filters are no longer included.

Figure 4:
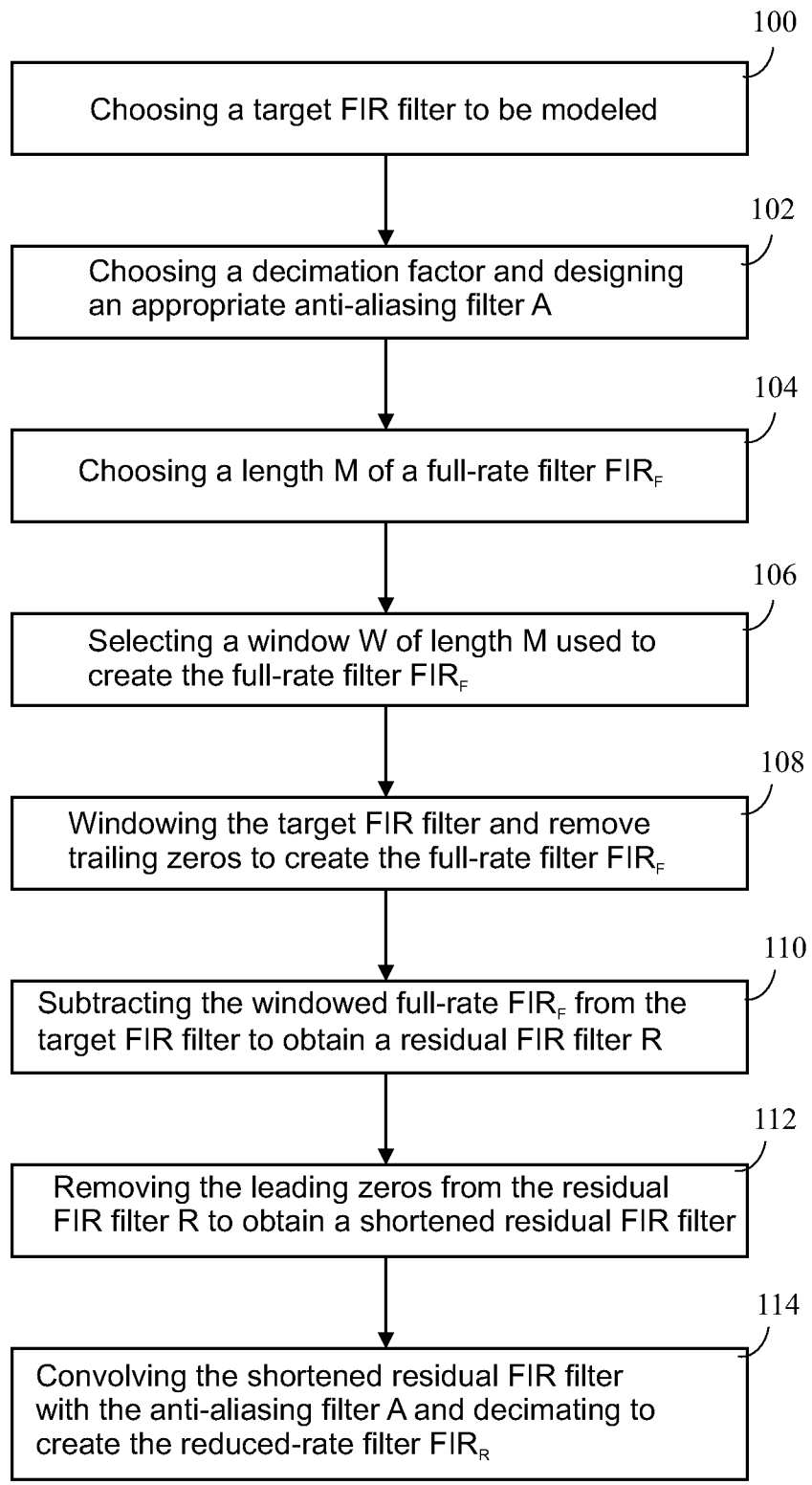
FIG. 4 is a method for computing a pair of FIR filters according to the present invention for use in the improved multi-rate filter.

FIG. 4 is a method for computing the full-rate $FIR_F$ and reduced-rate $FIR_R$ FIR filters 42 and 46 according to the present invention for use in the improved multi-rate filter 40. The filters are computed using the following steps. Choosing a target FIR filter to be modeled at step 100. (A minimum, maximum, or linear phase filter is preferred. In order to achieve zero added latency, a minimum phase filter is preferred.) Choosing a decimation factor and designing an appropriate anti-aliasing filter A at step 102. (The anti-aliasing filter A is preferably linear phase and has an order which is an integer multiple of the decimation factor.) Choosing a length M of a full-rate filter $FIR_F$ at step 104. In order to achieve zero added latency, the length of the full-rate filter $FIR_H$ must be at least 1.5 times the length of the anti-aliasing filter A. Selecting a window W of length M used to create the full-rate filter $FIR_F$ at step 106. In order to achieve zero added latency, the window should start with a flat (1.0) region that has length in samples 1.5*<order of the anti-aliasing filter A>. If different filters are used for anti-aliasing the signal, anti-aliasing the residual filter R, and anti-imaging, then the 1.0 region should be the total group delay of all anti-aliasing and anti-imaging filters. The right half of a typical window (e.g. a Hann window) should be calculated to taper from 1 down to 0 at the length of the full-rate filter $FIR_F$. Windowing the target FIR filter and remove trailing zeros to create the full-rate filter $FIR_F$ at step 108. Subtracting the windowed full-rate $FIR_F$ from the target FIR filter to obtain a residual FIR filter R at step 110. Removing the leading zeros from the residual FIR filter R to obtain a shortened residual FIR filter at step 112. Convolving the shortened residual FIR filter with the anti-aliasing filter A and decimating to create the reduced-rate filter $FIR_R$ at step 114.

While a separate low pass filter is not present in the filter 40, an anti-aliasing filter is present as part of the down-sampler 44 and applied in a single step with the down sampling. Further, the up-sampler 48 includes "reconstruction or "anti-imaging" filtering. The up sampling and reconstruction filter are also preferably applied in a single step, since only 1/n samples of the reconstruction filter input are non-zero. Various up-samplers are known in the art and suitable for use with the present invention.

Where a linear phase filter is used, the high rate filter $FIR_F$ is symmetrically windowed, resulting in a reduced-rate filter $FIR_R$ with zeros in the center. An efficient implementation of the reduced-rate filter $FIR_R$ is obtained by breaking the reduced-rate filter $FIR_L$ into two non-zero parts and applying in a delay (or gap), corresponding to the number of zero sample discarded, to signal samples between the first non-zero part and the second non-zero part of the reduced-rate filter $FIR_R$.

Figure 5A:
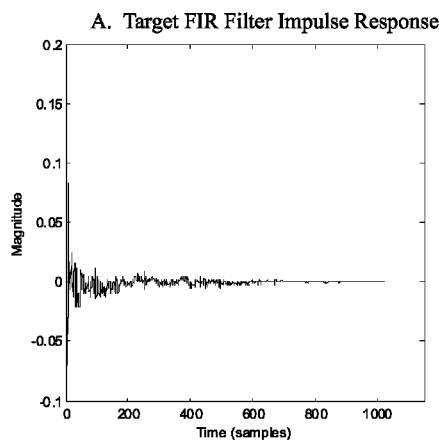
FIG. 5A is a target impulse response.
Figure 5B:
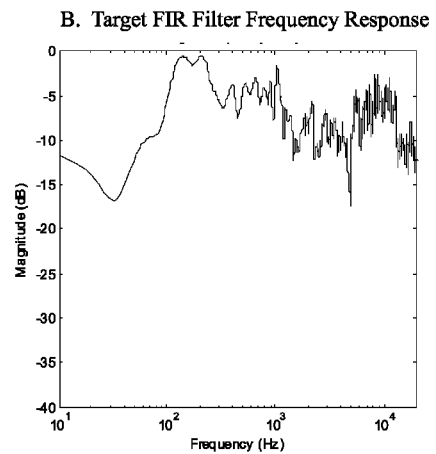
FIG. 5B is a target frequency response.

Impulse and frequency response plots are provided to show the results of each signal processing step of the present invention in FIGS. 5A-13B. A target impulse response of the prior art target FIR filter 10 is shown in FIG. 5A and a target frequency response of the prior art target FIR filter 10 is shown in FIG. 5B. The goal of the present invention is to obtain a good approximation of the target impulse and frequency responses with reduced processing requirements. The exemplar target filter in FIGS. 5A and 5B has a 48 k Hz sample rate and a filter length N of 1024. The N element target FIR filter 10 may be expressed as:

$$FIR = (c_1, c_2, c_2, \ldots, c_N)$$

Figure 6:
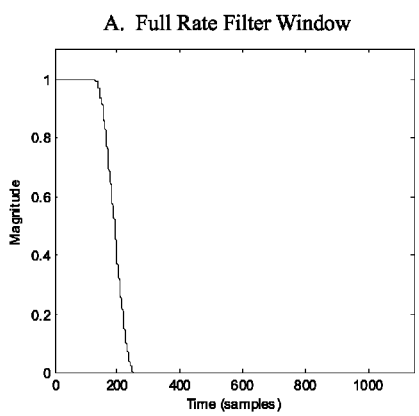
FIG. 6 is a window function.

A window function W for windowing the target FIR filter 10 to obtain the full-rate filter $FIR_F$ 42 is shown in FIG. 6. The window function W is used to reduce the length of the target FIR filter 10 to the desired full-rate FIR filter length. If zero latency is desired, the window function W must begin with a region of 1.0 values that is equal in length to the total latency of the reduced-rate path. In the example of FIG. 6, the window function W has a length M of 256, and the first 128 elements have values of 1.0. This latency is the sum of the group delays of the filter used to decimate the signal, the filter used to decimate the FIR, and the filter used to interpolate the filtered signal. The phase of the down-sampler 44 (see FIG. 3) must be taken into account in the group delay calculation. After an initial region, the window function W must be long enough to avoid an abrupt truncation of the full-rate filter $FIR_F$ 42. One of several known window functions W may be used, and an example of a suitable window function W comprises a left (leading) half of all ones and a right (trailing half), the right half of a known window. Examples of suitable known windows include a Hann window, a rectangular window, a hamming window, a tukey window, a cosine window, a lanczos window, a Bartlett window, a triangular window, a Gaussian window, a Bartlett-Hann window, a Blackman window, a Kaiser window, a Nuttall window, a Blackman-Harris, Blackman-Nuttall window, a Flat top window, a Bessel window, or a similar window. A preferred window is the Hann window, the Gaussian window, and the Kaiser window. An M element window function W may be expressed as:

$$W=(w1,w2,w3,\ldots w_M)$$

The length M of the window function W is preferably selected based on desired properties of the full-rate path and reduced-rate path. Zero latency is achieved by including 1.0's to compensate for the group delay of the reduced-rate path, but this requires a trade-off in the transition region of the window function W (the path from 1.0 s to approximately 0 at the end, i.e., the right half of the window function W). The overall length of the window function W is determined by the desired length of the full-rate filter, or vice-versa. The overall length M of the window function W, the number of 1.0 s, and the shape of the right half of the window function W, may all be adjusted to trade off characteristics, e.g., windowing over too short a region will induce artifacts comparable to truncation (i.e., rectangular windowing).

The window function W is applied to the target FIR filter 10 by term by term multiplying each sample of the target FIR filter 10 by the corresponding term of the window function W up to the length M of the window. The full-rate filter $FIR_F$ 42 is thus length M:

$$FIR_F=(c_1w_1,c_2w_2,c_3w_3,\ldots c_Mw_M)$$

The length M of the window W is preferably selected based on parameters of the reduced-rate path. Zero added latency is accomplished by setting the number of 1.0 elements (i.e., M/2) of the window W to the total group delay of the reduced-rate path's decimation and interpolation filters (not necessarily the same filter), as well as the residual FIR anti-aliasing filter A (which may or may not be the same as the signal decimation/interpolation filter(s)).

The latency may be adjusted as desired, but must be compensated for by a delay in either the full-rate path or the reduced-rate path if the total group delay of the reduced-rate path is made more or less than the full-rate path. In the simplest case, there are no 1.0's in the window, and the entire reduced-rate path latency must be taken into account by applying a delay to the full-rate path before the summation. In the opposite case, one might apply a window W to the target FIR filter with more 1.0's than necessary for zero latency (because optimal windowing may be target-filter-dependent) and elect to apply a delay to the reduced-rate path.

Figure 7A:
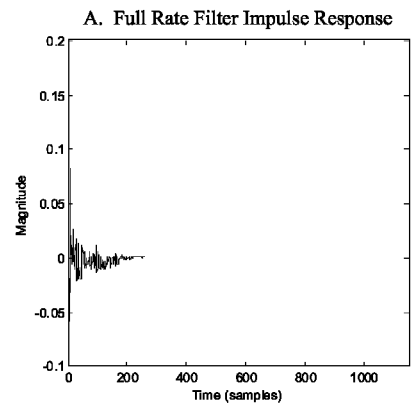
FIG. 7A is an impulse response of a full-rate filter according to the present invention.
Figure 7B:
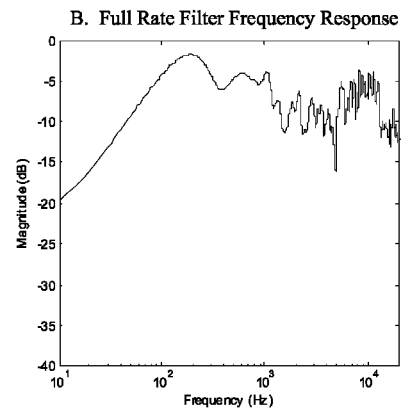
FIG. 7B is a frequency response of the full-rate filter according to the present invention.

An impulse response of the full-rate filter $FIR_F$ 42 is shown in FIG. 7A and a frequency response of the full-rate filter $FIR_F$ 42 is shown in FIG. 7B. The resulting full-rate filter $FIR_F$ 42 is applied to the input signal 12 at the full sampling rate. Although in this example the frequency response appears to have a high-pass effect, the actual response of the full-rate filter $FIR_F$ 42 will depend on the group delay of the target FIR filter 10. In most cases, the frequency response of the full-rate filter $FIR_F$ 42 will resemble a smoothed version of the target FIR filter 10.

The residual filter R is obtained by subtracting (term by term) the windowed full-rate filter $FIR_F$ 42 having a length M from the first M elements of target FIR filter 10 having a length N to obtain R having a length of N:

$$R=FIR-FIR_F=(c1-c1w1,c2-c2w2,\ldots c_M-c_Mw_M,c_{M+1},\ldots c_N)$$

Figure 8A:
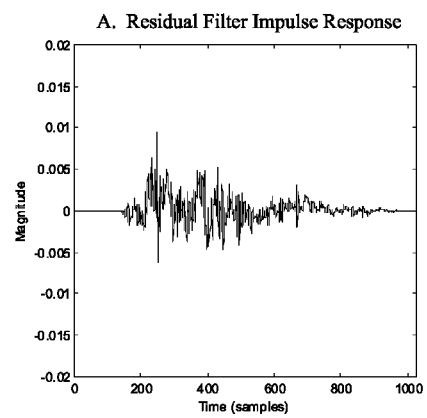
FIG. 8A is an impulse response of a residual filter according to the present invention.
Figure 8B:
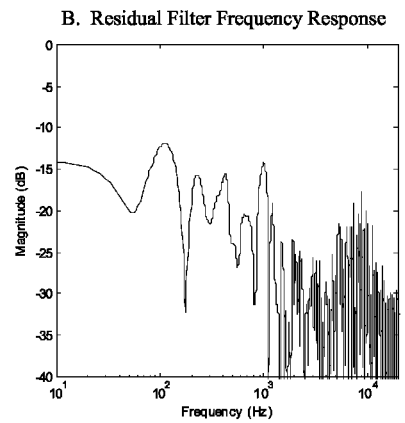
FIG. 8B is a frequency response of the residual filter according to the present invention.

The impulse response of the N element residual filter R is shown in FIG. 8A and the frequency response of the residual filter R is shown in FIG. 8B. The frequency response has the appearance of a low-pass filter even though no low-pass filter has been applied. This appearance is because most of the high frequency energy occurs early in the minimum phase response, and is present in the full-rate FIR filter $FIR_F$ 42. As seen in the impulse response, the residual filter R is characterized by leading zeros (an outcome of a window W of length M designed with a flat, 1.0 leading region of length approximately M/2), and where the last zero term in R is the M/2 term of R, and R may be expressed as:

$$R=(0,0,0\ldots 0,r_{M/2+1}\ldots r_N)$$

Such leading zeros may be removed leaving R' having N-128 (896 in this example) elements:

$$R'=(r_{M/2+1}\ldots r_N)$$

Proper sizing of the leading 1.0 flat region of the window function W allows the reduced-rate path response to be summed with the full-rate path response without a need to apply delay to the full-rate path. The length of the flat 1.0 leading region of half the length of the window W is an approximate preferred length. The actual length of the 1.0 leading region may vary depending on applications and multi-rate filters computed using a window W with the 1.0 leading region greater than or less than half the window W length are intended to come within the scope of the present invention.

Figure 9A:
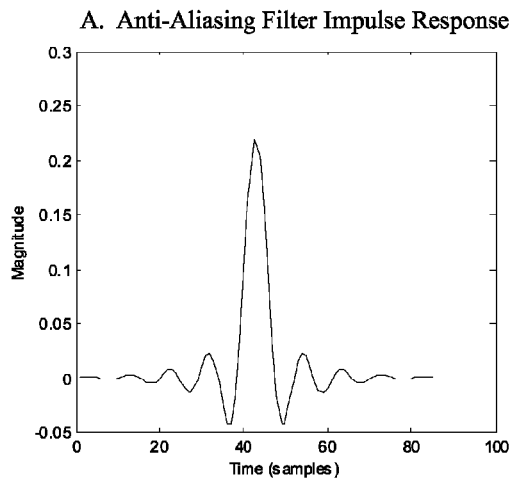
FIG. 9A is an impulse response of an anti-aliasing filter according to the present invention.
Figure 9B:
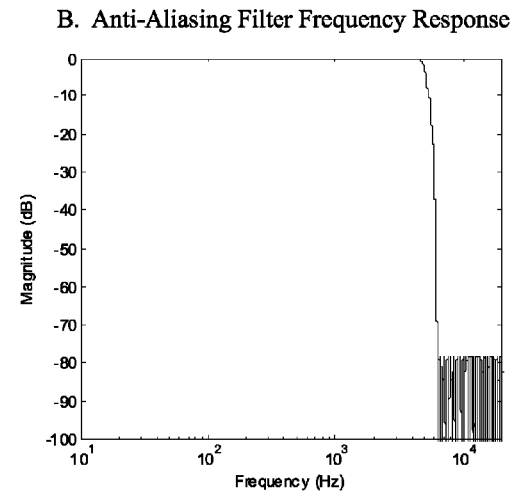
FIG. 9B is a frequency response of the anti-aliasing filter according to the present invention.

The down sampler 44 (see FIG. 3) includes an anti-aliasing filter A followed by down sampling. An impulse response of a suitable anti-aliasing filter A of length J (where J is 85 in this example) according to the present invention is shown in FIG. 9A and a frequency response of the anti-aliasing filter A is shown in FIG. 9B. The anti-aliasing filter A is designed to control aliasing resulting from the following down sampling and from the down-sampling to obtain the reduced-rate filter 46. The anti-aliasing filter A may also be used to down sample and decimate the input signal 12 in the down sampler 44 (see FIG. 4), when appropriate. Since the reduced-rate path will be summed with the high-rate path in the summer 26, the completed reduced-rate path must exhibit a whole number (integer) group delay. Odd symmetric filters of length X*K+1 (where X is a positive integer and K is the decimation rate) satisfy this because the impulse response obtained from down-sampling such a filter is also symmetric, and therefore has constant group delay (i.e., is linear phase). The anti-aliasing filter A may be represented as:

$$A=(a_1,a_2,a_3\ldots a_j)$$

Figure 10A:
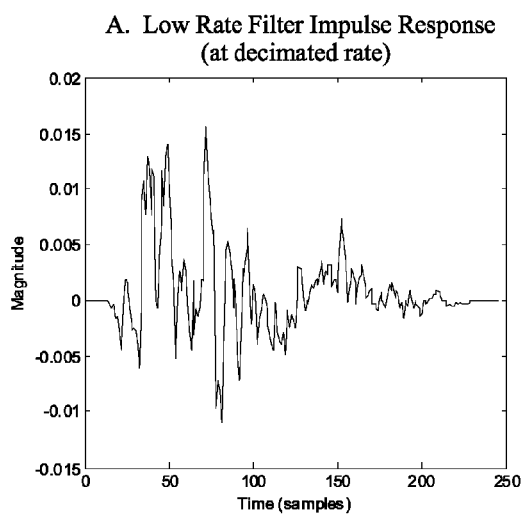
FIG. 10A is an impulse response of a reduced-rate filter according to the present invention.
Figure 10B:
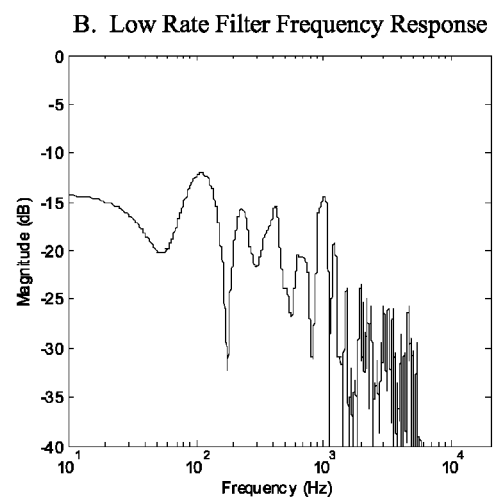
FIG. 10B is a frequency response of the reduced-rate filter according to the present invention.

An impulse response of the reduced-rate filter 46 according to the present invention is shown in FIG. 10A and a frequency response of the reduced-rate filter 46 is shown in FIG. 10B. The reduced-rate filter 46 is computed by convolving the anti-aliasing filter A with the residual filter R', then down-sampling (discarding n−1 out of every n samples, where n equals 4 in this example). The frequency response can be seen to roll off in the high frequencies due to the reduced-rate filter $FIR_R$. Where the anti-aliasing filter A comprises the elements d, the $n^{th}$ element reduced-rate filter $FIR_R$ 46 is:

$$FIR_g(n) = \Sigma_{j-1}{}^{j-J}A(j)R'(n-f)$$

Where the length of the reduced-rate filter $FIR_R$ 46 is the sum of the lengths of the anti-aliasing filter A and the residual filter R' minus one, or:

896+85−1=980 and decimation by four results in a 245 element reduced-rate filter $FIR_R$.

Figure 11A:
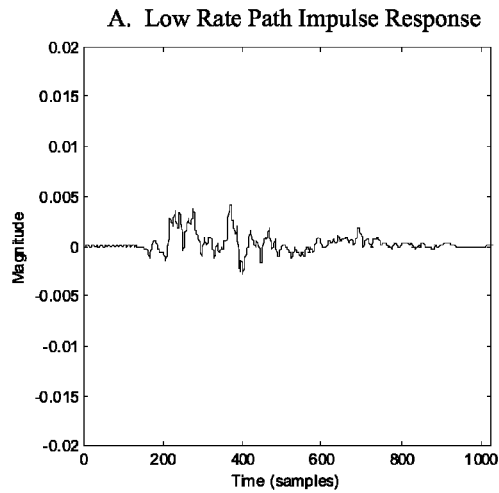
FIG. 11A is an impulse response of an up-samples signal from the reduced-rate filter according to the present invention.
Figure 11B:
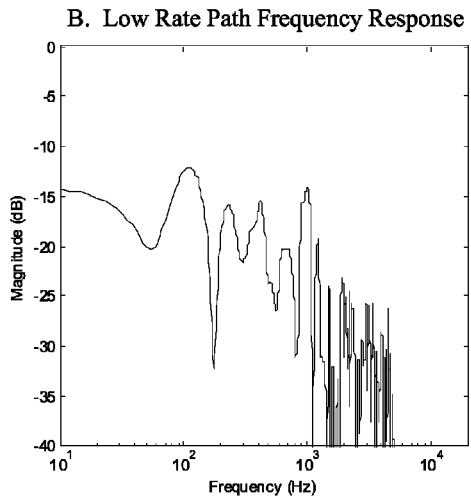
FIG. 11B is a frequency response of an up-samples signal from the reduced-rate filter according to the present invention.

An impulse response of the up-sampled signal 49 (see FIG. 3) from the reduced-rate filter path according to the present invention is shown in FIG. 11a and a frequency response of an up-sampled signal 49 is shown in FIG. 11B. The reduced-rate filter $FIR_R$ has 256 elements corresponding to a down sampling of four.

Figure 12A:
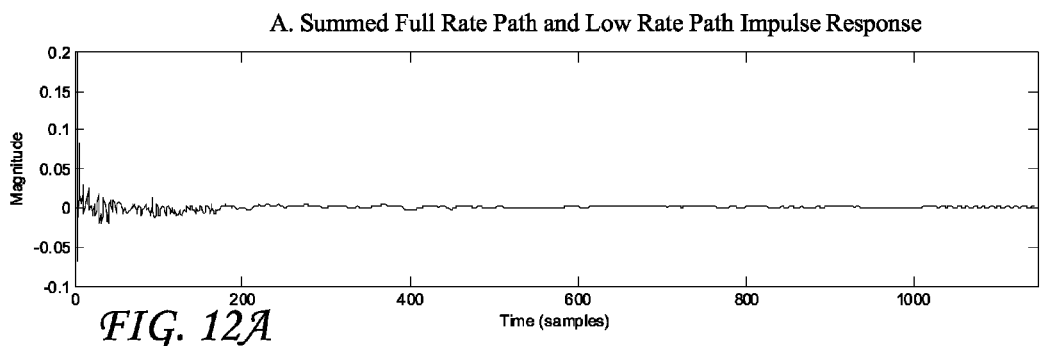
FIG. 12A is an impulse response of the summed signal according to the present invention.
Figure 12B:
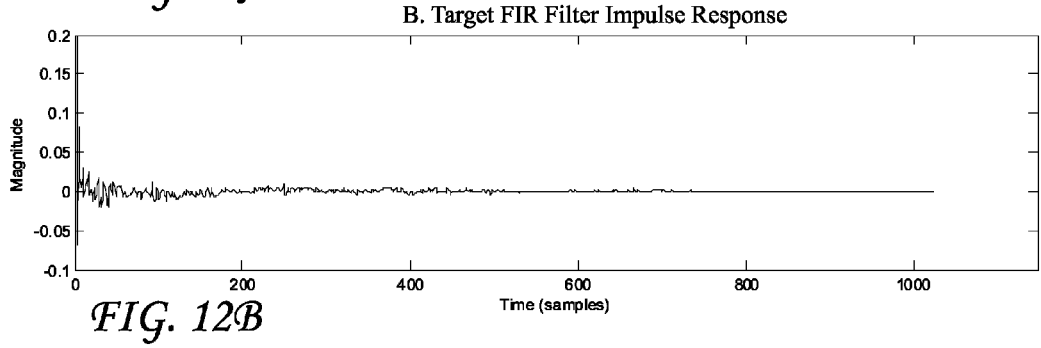
FIG. 12B is an impulse response of the target FIR filter for comparison to the impulse response of the summed signal.
Figure 13A:
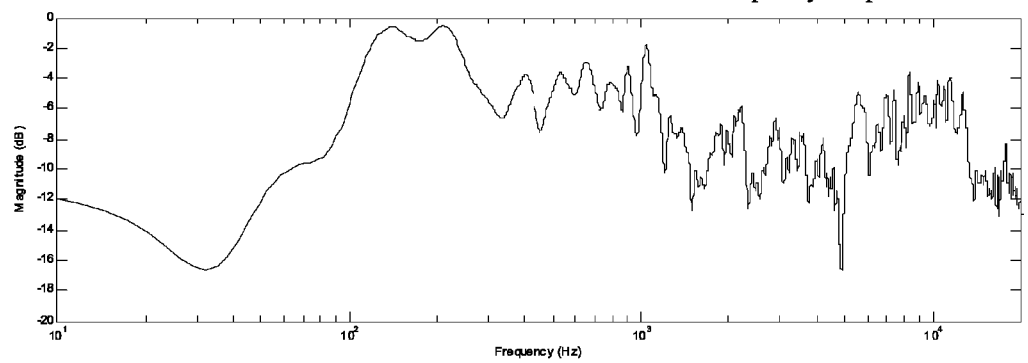
FIG. 13A is a frequency response of the summed signal according to the present invention.
Figure 13B:
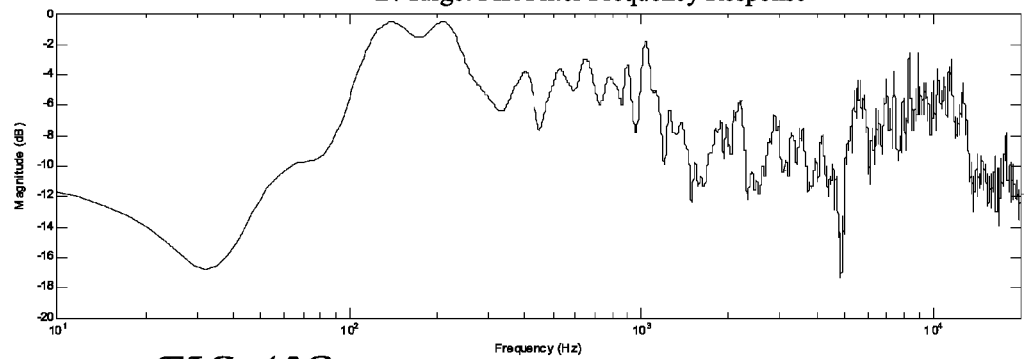
FIG. 13B is a frequency response of the target FIR filter for comparison to the frequency response of the summed signal.

An impulse response of the summed signal 14 (see FIG. 30) according to the present invention is shown in FIG. 12A and a corresponding plot of the impulse response of the target FIR filter 10, for comparison to the impulse response of the summed signal 14, is shown in FIG. 12B. A frequency response of the summed signal 14 is shown in FIG. 13A and a corresponding plot of the frequency response of the target FIR filter 10, for comparison to the frequency response of the summed signal 14, is shown in FIG. 13B. As seen in the plots, the filter according to the present invention has nearly the same impulse response as the target FIR filter, with slight smoothing beginning in the windowed region and continuing to the end of the filter. The filter according to the present invention has a longer impulse response due to the decimation and interpolation filters applied, but, in this example, no additional processing delay is incurred. The present invention thus provides virtually the same response as the target FIR filter with slight smoothing in the high frequencies, but achieved with reduced processing requirements.

The present invention is described above for cases where the target filter is efficiently performed using a full-rate path and a single reduced-rate path. In other instances, the single reduced-rate path shown in FIG. 4 may still require significant processing. In these other instances, the methods described above may be applied a second (or more) time in a nested topology replacing the reduced-rate filter $FIR_R$ 46 with additional filters of the form of the filter 40. For example, in a typical implementation, the filter may include three nested reduced-rate paths.

Figure 14:
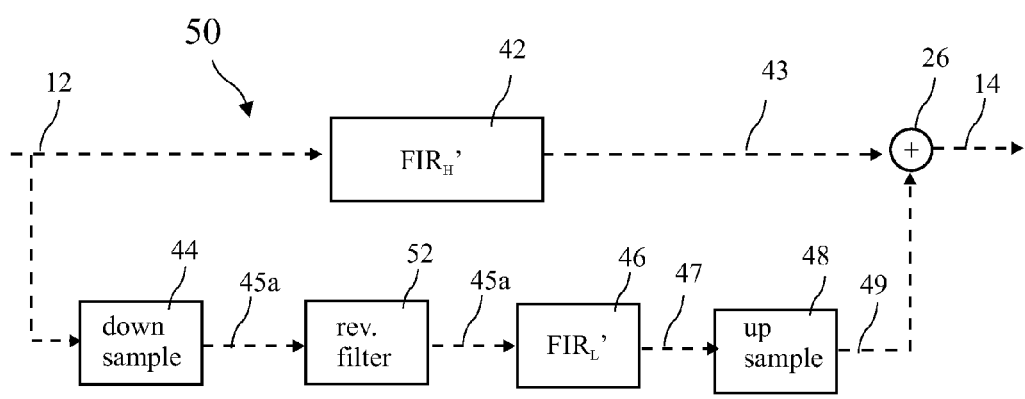
FIG. 14 shows an embodiment of the an improved multi-rate filter according to the present invention including a down sampled and reversed version of the anti-aliasing filter in the reduced-rate path.

A potential problem arises when the desired decimation filters are not nx+1 in length (where n is the decimation factor, and x is a positive integer >1). The resulting down sampled (every n−1 out of n samples are removed) filter is always asymmetric. For example, any even anti-aliasing filter A when decimated by an even factor, n exhibits asymmetry. A resulting asymmetric impulse response is not linear phase and does not have constant delay for all frequencies. In the case of any multi-rate processing, where the reduced-rate signal must be able to maintain the same phase as the full-rate signal (whether high-pass filtered or not), this would make even length FIR filters unacceptable for use as anti-aliasing filters. This may be addressed by taking advantage of a characteristic of FIR filters, that is, when an arbitrary FIR filter is convolved with the time-reverse of itself, the result is a symmetric filter having a linear phase impulse response. Such convolution may be applied to achieve constant group delay through the reduced-rate path of a multi-rate filter by including a down sampled and reversed filter RV 52 version of the anti-aliasing filter A in the reduced-rate signal path after the down-sampler as shown in FIG. 14. The reverse filter RV is computed by down sampling and reversing the anti-aliasing filter A. For example, where the anti-aliasing filter A is an 86 element filter, the reverse filter RV is a 21 element filter after down sampling by a factor of four.

In the instance where a reduced-rate filter can be derived by down-sampling a full-rate filter (for example, utilizing the filter calculation procedure of the present invention used to compute the reduced-rate filter $FIR_R$ 46), the reverse filter RV may effectively be implemented by convolving the anti-aliasing filter A with a full-rate filter (for example, the residual filter R) and down sampling the result, and further incorporating a different phase (or offset) in the down-sampling process. Rather than keeping the first sample, and discarding the following n−1 samples leaving ($a_1, a_{n+1}, a_{2n+1}, \ldots$), an offset OS (in samples), is applied during the down sampling so the retained samples become ($a_{1+OS}, a_{n+1+OS}, a_{2n+1+OS}, \ldots$). Doing this with the correct "phase" (or offset) has the same effect as reversing the down-sampled decimation filter because the original filter was symmetrical. The same anti-aliasing filter A may also be used in the down sampler 44 (see FIG. 3).

While the invention herein disclosed has been described by means of specific embodiments and applications thereof, numerous modifications and variations could be made thereto by those skilled in the art without departing from the scope of the invention set forth in the claims.

I claim:

1. An improved multi-rate digital filter comprising:
   a first path including a full-rate Finite Impulse Response (FIR) filter $FIR_F$, the full-rate filter $FIR_F$ receiving and filtering an input signal to produce a filtered full-rate signal;
   a second path in parallel to the first path and also receiving the input signal, the second path sequentially comprising:
      a down sampler processing the input signal to produce a reduced-rate signal;
      a reduced-rate FIR filter $FIR_R$ in signal communication with the down sampler to receive and processing the reduced-rate signal to produce a filtered reduced-rate signal; and
      an up sampler in signal communication with the reduced-rate filter $FIR_R$ to receive and process the filtered reduced-rate signal and to provide an up sampled filtered signal; and
   a summer in signal communication with the full-rate filter $FIR_F$ to receive the filtered full-rate signal and in signal communication with the reduced-rate filter $FIR_R$ to receive the up sampled filtered signal, the summer summing the filtered full-rate signal and the up sampled filtered signal to provide a filtered signal.

2. The improved multi-rate digital filter of claim 1, wherein the full-rate filter $FIR_F$ receives a wideband input signal.

3. The improved multi-rate digital filter of claim 1, wherein the full-rate filter $FIR_F$ receives an unfiltered version of the input signal.

4. The improved multi-rate digital filter of claim 1, wherein the full-rate filter $FIR_F$ is computed by windowing a target FIR filter with a window W.

5. The improved multi-rate digital filter of claim 4, wherein the window W comprises:
   a first leading region of ones; and
   a second trailing region of a second trailing half of a known window function.

6. The improved multi-rate digital filter of claim 5, wherein the known window function is selected from the group consisting of a Hann window, a Gausian window, and Kaiser window.

7. The improved multi-rate digital filter of claim 5, wherein:
   the target FIR filter has a length N; and
   the window W has a length of approximately N/4.

8. The improved multi-rate digital filter of claim 5, wherein the reduced-rate filter $FIR_R$ is computed by subtracting the full-rate filter $FIR_F$ from the target FIR filter to obtain a residual filter R and convolving the residual filter R with an anti-aliasing filter A.

9. The improved multi-rate digital filter of claim 8, wherein the reduced-rate filter $FIR_R$ is computed by subtracting the full-rate filter $FIR_F$ from the target FIR filter to obtain the residual filter R, removing leading zeros from the residual filter R to obtain a second residual filter, and convolving the second residual filter with the anti-aliasing filter A.

10. The improved multi-rate digital filter of claim 9, wherein the result of the convolution is decimated to reduce the number of elements in the reduced-rate filter $FIR_R$.

11. A method for filtering a signal, the method comprising:
   providing an input signal to a full-rate a Finite Impulse Response (FIR) filter $FIR_F$;
   filtering the input signal in the full-rate filter $FIR_F$ to produce a filtered full-rate signal;
   providing the input signal to a down sampler;
   processing the input signal in the down sampler to produce a reduced-rate signal;
   providing the reduced-rate signal to a reduced-rate FIR filter $FIR_R$;
   processing the reduced-rate signal in the reduced-rate filter $FIR_R$ to produce a filtered reduced-rate signal;
   providing the filtered reduced-rate signal to an up-sampler;
   processing the filtered reduced-rate signal in the up-sampler to provide a up-sampled filtered signal;
   providing the filtered full-rate signal and the up-sampled filtered signal to a summer; and
   summing the filtered full-rate signal and the up sampled filtered signal in the summer to provide a filtered signal.

12. The method of claim 11, further including designing the full-rate filter $FIR_F$ using the steps of:
   choosing a target FIR filter of length N to be modeled;
   designing a window W of length M used to create the full-rate filter $FIR_F$; and
   term by term multiplying the window W times the first M terms of the target FIR filter to create the full-rate filter $FIR_F$ of length M.

13. The method of claim 12, further including designing the reduced-rate filter $FIR_R$ using the steps of:
   choosing a decimation factor and design an appropriate anti-aliasing filter A;
   subtracting the windowed full-rate $FIR_F$ from the target FIR filter to obtain a residual FIR filter R of length N;
   removing the leading zeros from the residual FIR filter R to obtain a shortened residual FIR filter;
   convolving the shortened residual FIR filter with the anti-aliasing filter A; and
   decimating the result of the convolution to create the reduced-rate filter $FIR_R$.

14. The method of claim 13, further including the anti-aliasing filter A in the down-sampler.

15. The method of claim 11, further including delaying the signal in the reduced-rate path before summing with the signal in the full-rate path.

16. The method of claim 15, further including delaying the signal in the reduced-rate path before up-sampling.

17. The method of claim 15, further including delaying the signal in the reduced-rate path after up-sampling.

18. The method of claim 11, further including delaying the signal in the full-rate path before summing with the signal in the reduced-rate path.

19. A method for filtering a signal, the method comprising:
   designing a full-rate filter using the steps of:
      choosing a target Finite Impulse Response (FIR) filter of length N to be modeled;
      designing a window W of length M used to create a full-rate filter $FIR_F$; and
      term by term multiplying the window W times the first M terms of the target FIR filter to create the full-rate filter $FIR_F$ of length M;
   providing an input signal to the full-rate filter $FIR_F$;
   filtering the input signal in the full-rate filter $FIR_F$ to produce a filtered full-rate signal;
   designing a reduced-rate filter using the steps of:
      selecting a down sampling rate;
      designing an anti-aliasing filter A to control aliasing due to the down-sampling;
      subtracting the windowed full-rate filter $FIR_F$ from the target FIR filter to obtain a residual filter R of length N;
      removing the leading zeros from the residual filter R to obtain a shortened residual filter;
      convolving the shortened residual filter with the anti-aliasing filter A; and
      decimating the result of the convolution to create a reduced-rate filter $FIR_R$;
   providing the input signal to a down sampler;
   processing the input signal in the down sampler to produce a reduced-rate signal;
   providing the reduced-rate signal to a reduced-rate filter $FIR_R$;
   processing the reduced-rate signal in the reduced-rate filter $FIR_R$ to produce a filtered reduced-rate signal;
   providing the filtered reduced-rate signal to an up-sampler;
   processing the filtered reduced-rate signal in the up-sampler to provide an up-sampled filtered signal;
   providing the filtered full-rate signal and the up-sampled filtered signal to a summer; and
   summing the filtered full-rate signal and the up sampled filtered signal in the summer to provide a filtered signal.

* * * * *